United States Patent [19]
Cooper et al.

[11] Patent Number: 4,744,833
[45] Date of Patent: May 17, 1988

[54] ELECTROSTATIC REMOVAL OF CONTAMINANTS

[75] Inventors: Douglas W. Cooper, Millwood; Henry L. Wolfe, Pleasant Valley; James T. C. Yeh, Katonah, all of N.Y.

[73] Assignee: International Business Machines Corporation, Armonk, N.Y.

[21] Appl. No.: 61,753

[22] Filed: Jun. 11, 1987

[51] Int. Cl.[4] .............................................. B08B 3/12
[52] U.S. Cl. ..................................... 134/1; 15/1.5 R; 209/127.1
[58] Field of Search .......................... 134/1; 15/1.5 R; 209/127.1

[56] References Cited

U.S. PATENT DOCUMENTS

| | | | |
|---|---|---|---|
| 2,359,476 | 10/1944 | Gravley | 134/1 |
| 2,920,987 | 1/1960 | Landry et al. | 134/1 |
| 3,245,835 | 4/1966 | Gallino | 134/1 |

FOREIGN PATENT DOCUMENTS 476041  8/1971  U.S.S.R. .................................. 134/1

OTHER PUBLICATIONS

Young et al., IBM Technical Disclosure Bull., vol. 7(3) Aug. 1964, p. 181
Sachar, IBM Technical Disclosure Bull., vol. 18(5) Oct. 1975, pp. 1619-1621.

Primary Examiner—Asok Pal
Attorney, Agent, or Firm—Alexander Tognino; Philip J. Feig

[57] ABSTRACT

An apparatus and method for electrostatic removal of micron and sub-micron sized contaminant particles is disclosed herein. The apparatus and method comprise creating a potential difference with a megavolt/cm electrostatic field between two conducting bases in a predetermined geometrical relation to each other. An insulator (e.g. a dielectric film) is maintained at or near contact between one of the bases and the surface to be cleaned to electrostatically remove particles from said surface. The bases can be made to move relative to each other and the surface to be cleaned.

16 Claims, 1 Drawing Sheet

ELECTROSTATIC REMOVAL OF CONTAMINANTS

BACKGROUND OF THE INVENTION

1. Field of the Invention

This invention relates to the cleaning of surfaces, and more particularly, to methods and apparatus for dry cleaning of surfaces by use of electrostatic fields.

2. Description of Related Art

Particulate contamination is implicated in a large fraction of yield losses in the manufacturing of semiconductor chips and in yield and reliability losses in high density magnetic storage devices. Highly effective cleaning is recognized as one method to reduce such losses.

In order to remove contaminants from a surface the forces of adhesion of the contaminants must be diminished or overcome or both. Wet cleaning with surface active agents is typically one method for accomplishing both.

However, while wet cleaning can be effective in many instances, there are situations where they are disadvantageous, in that:

1. wet cleaning may leave harmful residues or
2. wetting the material may damage it or
3. the drying times may be prohibitive.

In these instances, dry cleaning is to be preferred.

One common method of dry cleaning, using jets of high velocity gas, is often used, but its effectiveness is known to diminish as particle size decreases, and become ineffective on contaminants of diameters of a few microns or smaller. In fact, it is known in the art that the removal of particles smaller than a few microns is difficult. Thus, there is ever increasing demand for a dry method for removing particle contaminants a few microns and smaller in diameter.

Electric fields have also been used as method of dry cleaning to remove charged particles from surfaces. For example, in U.S. Pat. No. 3,536,528 "Electrostatic Cleaner and Method" issued to De Geest, a method and apparatus for removing particles from the surface of a web is taught by exposing one face of the web to a corona discharge. The corona discharge charges the particles which charging assists in overcoming the adhesion forces of the particles. The web is then passed over an electrode of like (repelling) charge on the opposite side of the web and the particles can then be removed with air currents.

Another cleaning system technique which has been suggested previously makes use of a needle-like electrostatically chargeable probe for detaching particles from the surface. This technique is described in "Electrostatic Cleaning System," by D. C. Shang, IBM Technical Disclosure Bulletin, Vol. 22, No. 7, December 1979, pg. 2696. With the probe initially charged with a given electrostatic polarity, it is scanned over the surface whereby oppositely charged particles are attracted to and temporarily attached to the probe. Particles are subsequently removed from the probe at a remote site.

However, both of the above types of cleaning systems are limited to removing what is considered to be relatively large particles greater than 5 micron because of the dielectric field breakdowns at the field strengths required for the smaller particles. Moreover, as these larger particles are able to effectively be removed by other means, electrostatic cleaning systems have been less preferred methods for implementation.

Theory predicts that contaminant particles on a conductive surface will acquire a charge proportional to the particle area and the electric field. Theory also predicts that the particles will experience a net force in the field proportional to the field times the charge. Thus, the force (F) on the sphere is proportional to the square of the sphere diameter (d) and the square of the electric field (E):

$$F = k\, E^2 d^2$$

where $k = 3.8 \times 10^{-6} \mathrm{dyn/V^2}$ when the field is in volts/cm and the particle diameter is in cm, giving a force in dynes. Good approximations of the net force can be obtained by using the predicted charge, the field at the planar surface, and a correction for image-charge attraction of the sphere to the plane. From this net force equation for particles, it is readily understood that electric fields of greater strength are required to remove the particles of smaller diameter.

The dielectric breakdown of gas depends on geometry and gas density and the gas atomic or molecular characteristics. For air at normal temperature and pressure (NTP) in a gap of the order of 1 cm, field breakdown occurs at 10 kV/cm. With fields higher than this, arcing is known to occur.

While much of the previous work in this area was done in air at NTP and was thus limited to about 10 kV/cm, Myazdrikov and Puznov "Instrument for Determining Adhesion Forces in a Surface Particle System," Zavod LAB (USSR), 35 (10): 1265-1267 (1969), did go to somewhat higher fields (30-50 kV/cm) by using high-pressure gas. Air has its minimum dielectric strength at a fraction of an atmosphere. Thus, the use of high pressures and gases other than air (such as sulfur hexafluoride) are approaches to extending this field strength range.

However, to remove particles a few microns and smaller, electrostatic fields of hundreds of kV/cm to one MV/cm are taught to be required from the above force equations. These high field strengths have heretofore been unable to be obtained.

It is therefore an object of the present invention to provide a method and apparatus for cleaning semiconductor device surfaces of micron and sub-micron contamination by employing an electrostatic particle removing system.

SUMMARY OF THE INVENTION

Applicants have found that by using an insulator (e.g. a layer of a dielectric film such as KAPTON (TM) or other polymers, mica etc.) to insulate conductive plates from each other while applying large potential differences to the plates, high electrostatic fields can be generated capable of removing micron sized and submicron sized particles without dielectric arcing occurring.

According to a preferred embodiment of this invention, a metal base plate is connected to one terminal of a high voltage power supply. The substrate to be cleaned is then placed on the metal base plate, and held in position there. An insulating film is then located above the substrate. The film(s) is pressed to the substrate by a metal roller which is connected to the other terminal of the high voltage power supply. The roller is moved by a yoke (connected to a threaded drive) across the film/substrate combination, so that successive areas of film are made to touch successive areas of the substrate, without dragging the film across the substrate. The time for traversing of the film over the substrate is approximately one minute and under these conditions 5 micron and sub-micron sized particles are able to be removed from the substrate.

The foregoing and other objects, features and advantages of the invention will be apparent from the following more particular description of the invention as illustrated in the accompanying drawings.

DETAILED DESCRIPTION OF THE INVENTION

Figure 1:
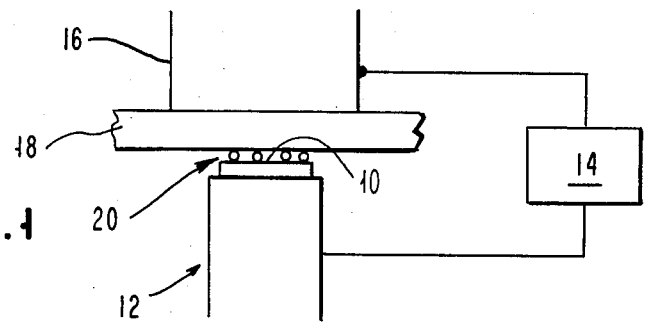
FIG. 1, is a side view showing the basic apparatus according to this invention.

The basic configuration of the apparatus according to the subject invention is shown in FIG. 1. In the FIGURE, a surface 10 which has particles on it and which particles are to be removed according to the subject invention is placed on a conductive base plate 12. The surface 10 can be either conductive or nonconductive. The conductive base plate 12 is connected to one side of a DC power supply 14. However, if the surface is conductive, the use of a base plate can be eliminated and connection made directly to the surface 10 itself.

Opposite and adjacent to said conducting plate 12 is a second plate 16 which is connected to the ground or opposite potential side of the DC power supply 14. Contiguous or adjacent to said plate 16 is an insulating material 18 which material has been selected on the basis of having a high dielectric strength to allow creation of high electric fields between the plates 12 and 16 without sparkover. The plates 12 and 16 can be either fixed or moveable or made to be a metal film backing to said insulating material 18.

In operation, the conductive plate 12 charges the particles 20 on surface 10 to the same potential as the surface 10 and sets up an electrostatic field between the plate 16 and the other plate 12. The thickness of the insulator 18 (h) and the voltage difference (V) between the plates 12 and 16 produce an electric field that is proportional to V/h. Thus, by substitution for the electric field in the force equation above, the particles will experience a force (F) away from the charged plate 12 that is proportional to the square of the particle diameter:

$$F = K(V/h)^2 d^2.$$

Previous attempts to use electrostatic forces to remove particles have had only partial success because they have used air or other gases at various pressures as the insulator between the electrodes. This limits the electric field to the breakdown field of the gas, about 10,000 V/cm for air at normal temperature and pressure. The breakdown field for polyimide, on the other hand, is more than 1 million V/cm. This makes it possible to develop electric fields which are sufficiently large to remove particles with diameters of a few micrometers, and smaller.

Another advantage in the use of a film is the ease with which very close spacings can be maintained over very large surfaces (dimensions thousands of times larger than the spacing) and irregular surfaces. In the example described above, corresponding to the apparatus of FIG. 1, a copper-film-backed polyimide insulator of 1 mil (0.0025 cm) was used, the 1 mil spacing being conveniently maintained by the polyimide. In contrast, use of gas or vacuum as an insulator would have required careful measurement of the spacing and special efforts to maintain parallelism of the planar electrodes. Such small spacings are desirable because high fields can be maintained at lower voltages than would be needed otherwise.

A still further advantage in the use of the film as compared to a gas or a vacuum is that the contaminant particles do not acquire a velocity that would cause them to rebound, as they can in transversing a larger required gap. The smaller the gap, the less kinetic energy acquired by the particle (approximately the electrostatic force times the gap width, $(V/h)^2 d^2 h$). Moreover, the film deforms and absorbs some of the energy, thus further reducing any likelihood of rebound.

A test of the apparatus of FIG. 1 was performed under a number of comparative operating conditions (i.e. alternative dielectric materials: polyimide, vacuum, and air) and with different types of samples (i.e. smooth metal, smooth insulator, rough insulator). The results are listed in Table 1.

TABLE 1

| SMOOTH METAL (REFLECTIVE) SURFACE | | | | |
|---|---|---|---|---|
| Particle Diam. | Particle Composition | Insulating Medium | Efficiency | Field (kV/cm) |
| 0.5 um | latex | polyimide | >95% | 7000 |
| 1.1 | latex | polyimide | 46%-98% | 2800 |
| 1.1 | latex | vacuum | 1% | 550 |
| 10.0 | latex | vacuum | 85% | 600 |
| 1-2 | Ni | vacuum | 6, 47% | 600 |
| 3-5 | Ni | vacuum | 85% | 222 |
| 5-8 | Ni | vacuum | >95% | 222 |
| 8-10 | Ni | vacuum | >85% | 222 |
| 0.5 | $SiO_2$ | polyimide | >95% | 8400 |
| 0.5 | $SiO_2$ | vacuum | <10% | 525 |
| 0.5 | $SiO_2$ | air | <10% | 20 |
| 9-15 | $SiO_2$ | vacuum | 99% | 140 |
| SMOOTH INSULATOR (GLASS, GLASS CERAMIC) SURFACE | | | | |
| | | | | Voltage (kV) |
| 3-17 | Ni | polyimide | >50% | 15 |
| 3-17 | Ni | air | >90% | 10 |
| 39 | $SiO_2$ | air | variable | 10 |
| ROUGH INSULATOR - PRODUCT (MLC, MOLY PADS) SURFACE | | | | |
| 3-17 | Ni | air | >90% | 10 |
| 3-17 | Ni | polyimide | >99% | 10 |

The contaminant particles used were polystyrene latex (to simulate polymer particles, such as photoresist), nickel (to simulate conductive metal particles, such as stainless steel), and $SiO_2$ (to simulate various nonconductive oxides).

Where the insulating medium is listed as polyimide, the contaminated surface was contacted with a dry polyimide film. Where the insulating medium is listed as vacuum, operation was in a vacuum chamber at less than one-millionth torr., to prevent electrical breakdown, and a counter-electrode with a stainless steel surface with a thin polymeric coating was used that did not contact the other stainless steel surface on which particles were placed for testing removal capabilities. Where the insulating medium is listed as air, operation was at ambient temperature and pressure and a counter-electrode covered with an insulating medium was used and kept away from the contaminated surface by use of insulating spacers that maintained an air gap.

The collection efficiency was determined by counting the number of particles in certain areas on the contaminated surface, returning to the same areas after the voltage (electric field) was increased in steps.

The electric field for the vacuum gap is simply the voltage divided by the spacing. The electric field where polyimide was the insulator had a value where the particles were (between the polyimide and the contaminated surface) of 3.6 times the voltage divided by the thickness of the polyimide (usually 0.5 mil=0.00125 cm) where 3.6 is the dielectric constant for polyimide. The field in the gap is determined by an equation that incorporates the spacing between the conductors and the thicknesses and dielectric constants of the polyimide layer and the air layer. The electric fields for the ceramic, glass slide, or the multilayer ceramic (MLC) surfaces have not been calculated. In particular, the MLC estimate depends in detail on whether the surface of the MLC is a conductor or an insulator, and in practice it is conductive in some regions and insulating in others, making field calculation difficult. However, it is hypothesized that votages much larger than those used would be acceptable to manufacturing designers. From the results in Table 1, it can be seen that:

a. smaller particles require higher fields to remove them;
b. latex particles are harder to remove than nickel or $SiO_2$ particles;
c. highest fields were attained with the polymer film, next highest with the vacuum, least with the air gap.

Theory predicts that the minimum particle size removed should be proportional to $1/E^2$, making high electric (E) fields crucial. The latex particles deform more than do the nickel or $SiO_2$ and adhere more tightly, perhaps due to deformation. The polymer film facilitated maintaining thicknesses of 0.5 mil (12 microns), and with a high dielectric breakdown strength, allowed high fields to be produced. Moreover, the field in the gap with the polymer film is higher than that in the dielectric by the factor 3.6. The vacuum has a high dielectric breakdown strength, too, but it is harder to maintain such a small spacing uniformly over areas of 1 $cm^2$ than with the film. Air breaks down at about 10 kV/cm for spacings of a mm, although this dielectric breakdown strength increases as the spacing gets smaller.

Figure 2:
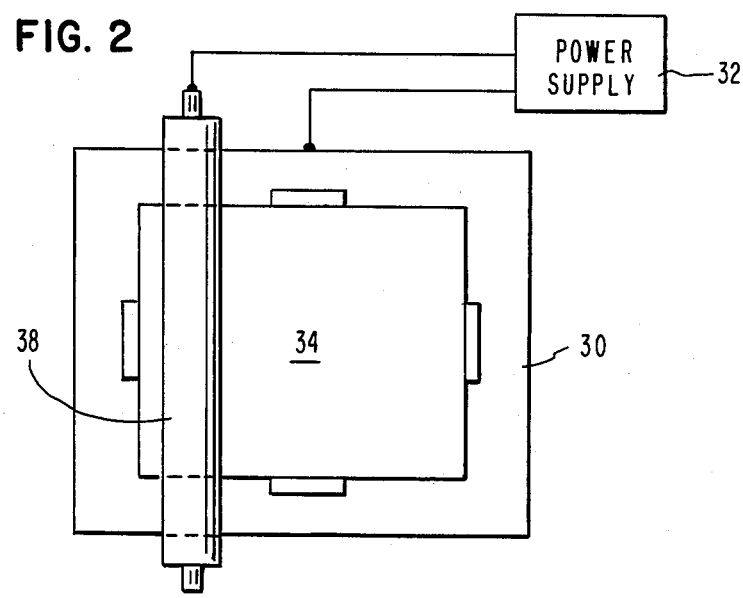
FIG. 2 is a top view of the apparatus of a preferred embodiment according to this invention.
Figure 3:
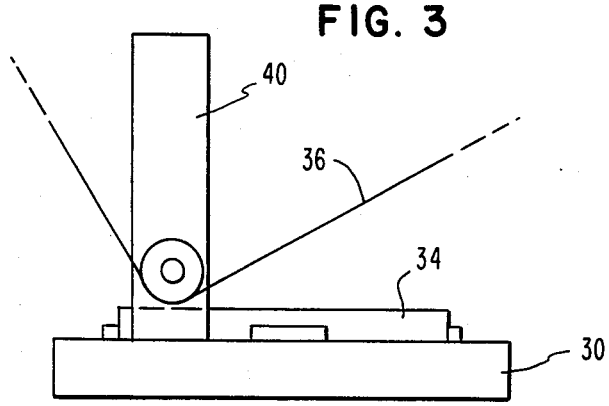
FIG. 3 is a side view of the apparatus of FIG. 2.

FIGS. 2 and 3 shows a top and side view of the preferred embodiment of the invention. In the FIGURES, a metal base 30 is connected to one terminal of a high voltage power supply 32. The substrate surface 34 to be cleaned was placed on the metal base 30 and fixed in position there. Above the surface 30 is a thin insulating film 36. A metal roller 38 is connected to the other terminal of the power supply and located above said insulating film 36 for pressing film to the the surface to be cleaned.

The roller is moved by the yoke 40 (connected to a threaded drive) across the film/substrate combination, so that successive areas of film are made to touch successive areas of the substrate 34, without dragging the film 36 across the substrate 34. The total time for passage of the film 34 across the surface is approximately one minute for each test.

The roller and the base can be made of stainless steel or other conducting material.

The apparatus of FIGS. 2 and 3 was tested using a variety of surfaces. In one test a ceramic substrate with a highly reflective surface and no internal metallic surfaces.

The film which was used was PERMALAM (TM) AV 150, manufactured by Laminex, Inc., of Charlotte, N.C. It was 1.5 mil thick, 0.5 mil of polyester (shiny) laminated with 1.0 mil of polyethylene (dull). The polyester (shiny) side was used to contact the substrate. However, this polyester/polyethylene is neither the preferred nor only polymer which can be use herein.

The simulated particles were Ni spheres or glass spheres. These particles were applied dry to the substrate. Optical microscopy (at 200×) was used for sizing and counting the particles. For the Ni spheres, only those spheres appearing to be between 1 mm and 1.5 mm in diameter on the photographs were counted; these had diameters between 5 and 7.5 microns (5–8 $\mu m$ in significant figures). The glass spheres were 9 to 15 microns (12 microns nominal) in diameter; no sizing was done to discriminate between larger and smaller glass spheres, and they were counted without regard to size.

Generally, photographs were taken at the start, after the particles had been applied; the particles in the areas were counted. The electrostatic field was then applied through the film/roller assembly. The same areas were photographed and the particles were recounted. Removal efficiency was determined as the number of singlet particles removed divided by the number of those same singlet particles originally present.

Table 2 gives the number of singlet particles at the start and the number of these left after the application of 10 kV through the film/roller assembly. The table also gives the removal efficiencies and the means, standard deviations (SD), and standard errors (SE) of the means for the removal efficiencies. In addition, ninety-five percent confidence intervals on the estimates of the mean are given, as determined from Student's t distribution critical values and the standard errors.

TABLE 2

| | PARTICLE COUNTS AND REMOVAL EFFICIENCY STATISTICS | | | | | |
|---|---|---|---|---|---|---|
| Con- | Particle | | Efficiency Statistics | | | 95% |
| dition | Counts | Efficiencies | Mean | SD | SE | Interval |
| | Nickel Spheres (5–8 $\mu m$) | | | | | |
| start | 90 | | | | | |
| 10 kV | 1 | 0.989 | | | | |
| start | 135 | | | | | |
| 10 kV | 9 | 0.933 | | | | |
| start | 120 | | | | | |
| 10 kV | 2 | 0.983 | | | | |
| start | 75 | | | | | |
| 10 kV | 1 | 0.987 | | | | |
| | | | 0.973 | 0.027 | 0.0134 | 0.93–1.00 |
| | Glass ($SiO_2$) Spheres (9–15 $\mu m$) | | | | | |
| start | 45 | | | | | |
| 10 kV | 0 | 1.000 | | | | |
| start | 46 | | | | | |
| 10 kV | 0 | 1.000 | | | | |
| start | 27 | | | | | |
| 10 kV | 0 | 1.000 | | | | |
| start | 22 | | | | | |
| 10 kV | 1 | 0.955 | | | | |
| | | | 0.991 | 0.020 | 0.009 | 0.96–1.00 |

From Table 2, it can be seen that for the nickel spheres of 5–8 $\mu m$ diameter, the ninety-five percent confidence interval on the mean efficiency is 97.3±4.3%. The same kind of analysis indicates there is ninety percent confidence level that the mean efficiency is 95% or greater. Furthermore, it was observed that even smaller Ni particles were removed by this cleaning procedure. For the glass spheres 9-15 μm in diameter the ninety-five percent confidence interval on the mean efficiency is 99.1±2.5%, which can be shown to be equivalent to a ninety-nine percent confidence level that the mean efficiency is 95% or greater.

In a second test of the device of FIGS. 2 and 3 multilayered ceramic substrates (Samples A and B) with molybdenum features were used as the samples to be cleaned.

For Sample A, the films used were the 1.5 mil PERMALAM (TM) film manufactured by Laminex, Inc., of Charlotte, N.C. (1.5 mil thick, 0.5 mil of polyester laminated with 1.0 mil of polyethylene) together with a 5 mil thick KAPTON (TM) polyimide film. For Sample B a single film of the PERMALAM (TM) 1.5 mil film was used.

The particles used were the same as described for the ceramic substrate above. The test criteria were also the same as described therein.

For Sample A with the two films, at 10 kV, 19 of 19 glass particles atop the pads were removed. In addition, 123 of the 130 glass particles in the region around the pads were removed. There was no statistically significant difference found between the pads and the rest of the region, in terms of particle removal. The total removal was 142 out of 149 or 95.3%.

For Sample A with the two films, at 10 kV, 34 of 34 Ni particles atop the pads were removed. In addition, 260 of the 276 Ni particles in the region around the pads were removed. There was no statistically significant difference found between the pads and the rest of the region, in terms of particle removal. The total removal was 294 out of 310 or 94.8%.

For Sample B with the 1.5 mil PERMALAM film, the highest voltage differences achievable without unacceptable arcing were 3 and 4 kV, and the data from these runs was combined.

For Sample B with the 1.5 mil film, at 3-4 kV, 28 of 28 glass particles atop the pads were removed and 161 of 163 glass particles in the region around the pads were removed. There was no statistically significant difference found between the pads and the rest of the region, in terms of particle removal. The total removal fraction was 189 out of 191 or 99.0%.

For Sample B with the 1.5 mil film, at 3-4 kV, 7 of 8 particles atop the pads were removed and 62 of 64 particles in the region around the pads were removed. There was no statistically significant difference found between the pads and the rest of the substrate region, in terms of particle removal. The total removal fraction was 69/72 or 95.8%.

When the glass spheres were used as test contaminants, but different film/voltage combinations were employed, the total removal fractions of 189/191=0.990 versus 142/149=0.953 were statistically significantly different, indicating that the combination of 3-4 kV through the 1.5 mil PERMALAM film operating on Sample B produced greater removal than did the combination of 10 kV through the two film (1.5 mil PERMALAM and 5 mil KAPTON) operating on Sample A when removing the 12 m glass spheres. No statistically significant difference was demonstrated with the Ni spheres (69/72=0.958 for the one film with Sample B; 294/310=0.948 for the two films with Sample A).

While the invention has been described with respect to particular embodiments thereof, it will be apparent to those of skill in the art, that modifications may be made thereto without departing from the spirit and scope of the present invention.

Having thus described our invention, what we claim as new, and desire to secure by Letters Patent is:

1. A method for removing micron and/or sub-micron sized contaminant particles from a surface comprising the steps of:
    (a) establishing a first electrically conductive base means, said first base means being connected to one terminal of a high voltage, direct current power supply,
    (b) locating the surface from which the particles are to be removed on said first base means,
    (c) establishing a second electrically conductive base means in a predetermined and geometrical position at least one particle diameter apart from said first base means and said surface, said second base means being connected to the other terminal of said high voltage, direct current power supply,
    (d) placing an insulator between said second base means and said surface from which particles are to be removed, and
    (e) applying an electric field of approximately 0.1 MV/cm or larger between said first and second base means to electrostatically remove said particles from said surface.

2. A method according to claim 1 wherein said insulator is comprised of a dielectric film.

3. A method according to claim 2 wherein said dielectric film is comprised of a polymer.

4. A method according to claim 3 wherein said polymer film is comprised of a lamination of polyester and polyethylene.

5. A method according to claim 2 wherein said dielectric film is comprised of mica.

6. A method according to claim 1 wherein said insulator is comprised of a dielectric film under a vacuum.

7. A method according to claim 1 wherein said insulator is comprised of a dielectric film under a high gaseous pressure.

8. A method according to claim 2 wherein said dielectric film is between approximately 0.1 to 1.0 mil. thick.

9. A method according to claim 2 wherein said first and second conducting bases are made to move relative to each other for traversing said film across said surface.

10. A method according to claim 9 wherein said second base is a roller.

11. A method according to claim 9 wherein said surface is a conducting medium.

12. A method according to claim 9 wherein said surface is a nonconducting medium.

13. A method according to claim 9 wherein said surface is a composite medium comprised of conducting and nonconducting parts.

14. A method according to claim 9 wherein the potential difference between bases is in the range 0.1 to 20.0 KV.

15. A method according to claim 1 wherein said surface to be cleaned is conducting and acts as the first electrical base means.

16. A method according to claim 1 wherein said insulator is comprised of a conductor laminated with a dielectric film and said conductor acts as the first electrical base means.

* * * * *